(12) United States Patent
Seo et al.

(10) Patent No.: US 10,638,619 B2
(45) Date of Patent: Apr. 28, 2020

(54) COVER WINDOW HAVING CURVED CORNER PORTION AND DISPLAY DEVICE INCLUDING THE SAME

(71) Applicant: Samsung Display Co. Ltd., Yongin-si, Gyeonggi-do (KR)

(72) Inventors: Hyun Seung Seo, Anyang-si (KR); Jong Hwan Cho, Ansan-si (KR); Woo Jin Cho, Yongin-si (KR)

(73) Assignee: SAMSUNG DISPLAY CO. LTD., Gyeonggi-Do (KR)

( * ) Notice: Subject to any disclaimer, the term of this patent is extended or adjusted under 35 U.S.C. 154(b) by 8 days.

(21) Appl. No.: 15/937,252

(22) Filed: Mar. 27, 2018

(65) Prior Publication Data

US 2018/0368270 A1 Dec. 20, 2018

(30) Foreign Application Priority Data

Jun. 16, 2017 (KR) ........................ 10-2017-0076866

(51) Int. Cl.
| | | |
|---|---|---|
| H05K 5/00 | (2006.01) |
| H01L 51/52 | (2006.01) |
| H05K 5/03 | (2006.01) |
| G06F 1/16 | (2006.01) |
| H01L 27/32 | (2006.01) |

(52) U.S. Cl.
CPC ............ H05K 5/0017 (2013.01); G06F 1/16 (2013.01); G06F 1/1637 (2013.01); H01L 51/524 (2013.01); H05K 5/03 (2013.01); *H01L 27/32* (2013.01); *H01L 51/5237* (2013.01); *H01L 2251/5338* (2013.01)

(58) Field of Classification Search
CPC ....... H05K 5/0017; H05K 5/03; H01L 51/524
See application file for complete search history.

(56) References Cited

U.S. PATENT DOCUMENTS 7,319,291 B2 * 1/2008 Fujitani ................... H01J 11/12
313/582
9,572,267 B2 * 2/2017 Cho ........................ B29C 39/12
(Continued)

FOREIGN PATENT DOCUMENTS

| KR | 1020140093360 A | 7/2014 |
| KR | 1020140103547 A | 8/2014 |

(Continued)

*Primary Examiner* — Daniel P Wicklund
*Assistant Examiner* — Christopher L Augustin
(74) *Attorney, Agent, or Firm* — Cantor Colburn LLP

(57) ABSTRACT

A cover window includes: a flat portion including in a top plan view, first and second sides respectively extending in first and second directions; a top curved portion contacting the first side and extending therefrom in the second direction; a left curved portion contacting the second side and extending therefrom in the first direction; and a first corner curved portion which connects the top and left curved portions to each other. In cross-section, the first corner curved portion includes: and a bottom end surface which connects inner and outer surfaces to each other, in the top plan view, the bottom end surface includes: a central portion having a first width, and a peripheral portion which is disposed outside the central portion in the first and second directions, the peripheral portion having a second width smaller than the first width.

18 Claims, 16 Drawing Sheets

(56) References Cited

U.S. PATENT DOCUMENTS

| | | | | |
|---|---|---|---|---|
| 2012/0075823 | A1* | 3/2012 | Park | G02F 1/1333 361/784 |
| 2012/0288661 | A1* | 11/2012 | Wei | C03B 23/02 428/64.1 |
| 2013/0002583 | A1* | 1/2013 | Jin | G06F 1/1637 345/173 |
| 2014/0104762 | A1* | 4/2014 | Park | G06F 1/1652 361/679.01 |
| 2014/0139771 | A1* | 5/2014 | Choi | G09G 3/20 349/43 |
| 2014/0197380 | A1* | 7/2014 | Sung | H01L 27/3241 257/40 |
| 2014/0198436 | A1* | 7/2014 | Lim | H04M 1/0266 361/679.01 |
| 2014/0356586 | A1* | 12/2014 | Cho | G02B 1/105 428/174 |
| 2014/0370244 | A1* | 12/2014 | Kinoshita | C03C 21/002 428/177 |
| 2015/0146390 | A1* | 5/2015 | Park | G02F 1/133308 361/752 |
| 2016/0255735 | A1* | 9/2016 | Han | H05K 5/0017 359/894 |
| 2017/0317309 | A1* | 11/2017 | Yang | H05K 5/0086 |
| 2017/0324060 | A1* | 11/2017 | Kim | G02B 5/208 |
| 2017/0357113 | A1* | 12/2017 | Yamazaki | G02B 5/30 |
| 2018/0113241 | A1* | 4/2018 | Powell | G02B 5/045 |
| 2018/0128973 | A1* | 5/2018 | Powell | G02B 6/06 |
| 2018/0357979 | A1* | 12/2018 | Nakamura | G09G 5/10 |

FOREIGN PATENT DOCUMENTS

| | | |
|---|---|---|
| KR | 101669026 B1 | 10/2016 |
| KR | 101706559 B1 | 2/2017 |

* cited by examiner

COVER WINDOW HAVING CURVED CORNER PORTION AND DISPLAY DEVICE INCLUDING THE SAME This application claims priority to Korean Patent Application No. 10-2017-0076866, filed on Jun. 16, 2017, and all the benefits accruing therefrom under 35 U.S.C. § 119, the content of which in its entirety is herein incorporated by reference.

BACKGROUND

1. Field

One or more embodiment of the invention relates to a cover window and a display device including the same.

2. Description of the Related Art

With the development of multimedia, display devices are becoming increasingly important. Accordingly, various types of display devices such as liquid crystal displays ("LCDs") and organic light emitting displays ("OLEDs") are being used.

Of these display devices, OLEDs have a relatively wide viewing angle, excellent contrast and fast response speed. Due to these advantages, the OLEDs are drawing attention as next-generation display devices.

Some of the OLEDs may have bending characteristics. Such flexible display devices may have a flat display area and a curved display area. Accordingly, a cover window having a curved surface to correspond to the shape of a flexible display device is being actively researched.

SUMMARY

One or more embodiment of the invention provides a cover window which can reduce or effectively prevent the occurrence of an attachment defect at corner curved portions thereof during the manufacture of a display device.

One or more embodiment of the invention also provides a display device including a cover window and a display panel stably attached to each other.

However, embodiments of the invention are not restricted to the one set forth herein. The above and other features of the invention will become more apparent to one of ordinary skill in the art to which the invention pertains by referencing the detailed description of the invention given below.

According to an embodiment of the invention, there is provided a cover window including: a flat portion which defines a front outer surface of a display device, the flat portion including in a top plan view, a first side extending in a first direction and a second side which contacts the first side and extends in a second direction different from the first direction; a top curved portion which contacts the first side of the flat portion and extends from the first side in the second direction; a left curved portion which contacts the second side of the flat portion and extends from the second side in the first direction; and a first corner curved portion which connects the top curved portion and the left curved portions to each other. In cross-section, the first corner curved portion includes: an outer surface, an inner surface, and a bottom end surface connecting the outer surface thereof and the inner surface thereof to each other, in the top plan view, a width of the bottom end surface of the first corner curved portion, is taken from the inner surface thereof to the outer surface thereof, and the bottom end surface of the first corner curved portion includes: a central portion having a first width, and a peripheral portion which is disposed outside the central portion in the first and second directions, the peripheral portion having a second width smaller than the first width.

In addition, in the cross-section the inner surface of the first corner curved portion may have a first radius of curvature, and the outer surface of the first corner curved portion may have a second radius of curvature.

The first radius of curvature may be greater than the second radius of curvature.

In addition, in the top plan view, a width of the bottom end surface may gradually decrease from the central portion toward the peripheral portion.

In addition, a thickness of the flat portion may be the same as a thickness of each of the top curved portion and the left curved portion.

In addition, in the cross section, an angle formed by an extension line of the flat portion and an extension line of an end of the left curved portion may be about 90 degrees.

In addition, the angle formed by an extension line of the flat portion and an extension line of an end of the left curved portion may be about 120 degrees.

In addition, an extension line of the flat portion and an extension line of an end of the left curved portion may be parallel to each other.

In addition, in the cross-section, each the left curved portion and the top curved portion may include an outer surface, an inner surface, and a bottom end surface connecting the outer surface thereof and the inner surface thereof to each other, the inner surface of the left curved portion or the top curved portion may have a third radius of curvature, and the outer surface of the left curved portion may have a fourth radius of curvature.

The third radius of curvature may be greater than the fourth radius of curvature.

In addition, the cover window may further include a colored film which overlaps the top curved portion and the first corner curved portion.

In addition, the colored film may partially overlap the flat portion and the left curved portion.

In addition, in the top plan view, the first corner curved portion may include a first boundary at which the inner surface thereof and the bottom end surface thereof meet, and the first boundary may have a parabola shape that is convex toward the outer surface with respect to the flat portion.

In addition, wherein in the top plan view, the first corner curved portion may include a first boundary at which the inner surface thereof and the bottom end surface thereof meet, and the first boundary may be a straight line.

In addition, in the top plan view, the first corner curved portion may include a first boundary at which the inner surface thereof and the bottom end surface thereof meet, and the first boundary may have a parabola shape that is convex toward the flat portion.

According to another embodiment of the invention, there is provided a display device including: a display panel which displays images with light; and a cover window which is disposed on a front of the display panel. The cover window includes: a flat portion which defines a front outer surface of the display device, the flat portion including in a top plan view, a first side extending in a first direction and a second side which contacts the first side and extends in a second direction different from the first direction; a top curved portion which contacts the first side of the flat portion and extends from the first side in the second direction; a left curved portion which contacts the second side of the flat portion and extends from the second side in the first direction; and a first corner curved portion which connects the top curved portion and the left curved portion to each other. In cross-section, the first corner curved portion includes an outer surface, an inner surface, and a bottom end surface connecting the outer surface and the inner surface to each other, in the top plan view, a width of the bottom end surface of the first corner curved portion, is taken from the inner surface thereof to the outer surface thereof, and the bottom end surface of the first corner curved portion includes: a central portion having a first width, and a peripheral portion disposed outside the central portion un the first and second directions, the peripheral portion having a second width smaller than the first width.

In addition, the display panel may include a display area at which the images are displayed, the display area including: a flat display area which provides an image to the flat portion of the cover window to be displayed at the flat portion, and a left curved display area disposed which provides an image to the left curved portion of the cover window to be displayed at the left curved portion, the left curved display area extended in the first direction from a first side of the flat display area.

In addition, the display area of the display panel may further include a top curved display area which provides an image to the top curved portion of the cover window to be displayed at the top curved portion, the top curved display area extended in the second direction from a second side of the flat display area.

In addition, the display area of the display panel may further include a first corner curved display area which provides an image to the first corner curved portion of the cover window to be displayed at the first corner curved portion, the first corner curved display area connecting the left curved display area and the top curved display area to each other.

In addition, the cover window may include plastic.

In addition, in the cross-section, the inner surface of the first corner curved portion of the cover window may have a first radius of curvature, and the outer surface of the first corner curved portion of the cover window has a second radius of curvature, and the first radius of curvature may be greater than the second radius of curvature.

In addition, in the top plan view, a width of the bottom end surface may gradually decrease from the central portion toward the peripheral portion.

BRIEF DESCRIPTION OF THE DRAWINGS

These and/or other features will become apparent and more readily appreciated from the following description of the embodiments, taken in conjunction with the accompanying drawings in which.

DETAILED DESCRIPTION

Figure 1:
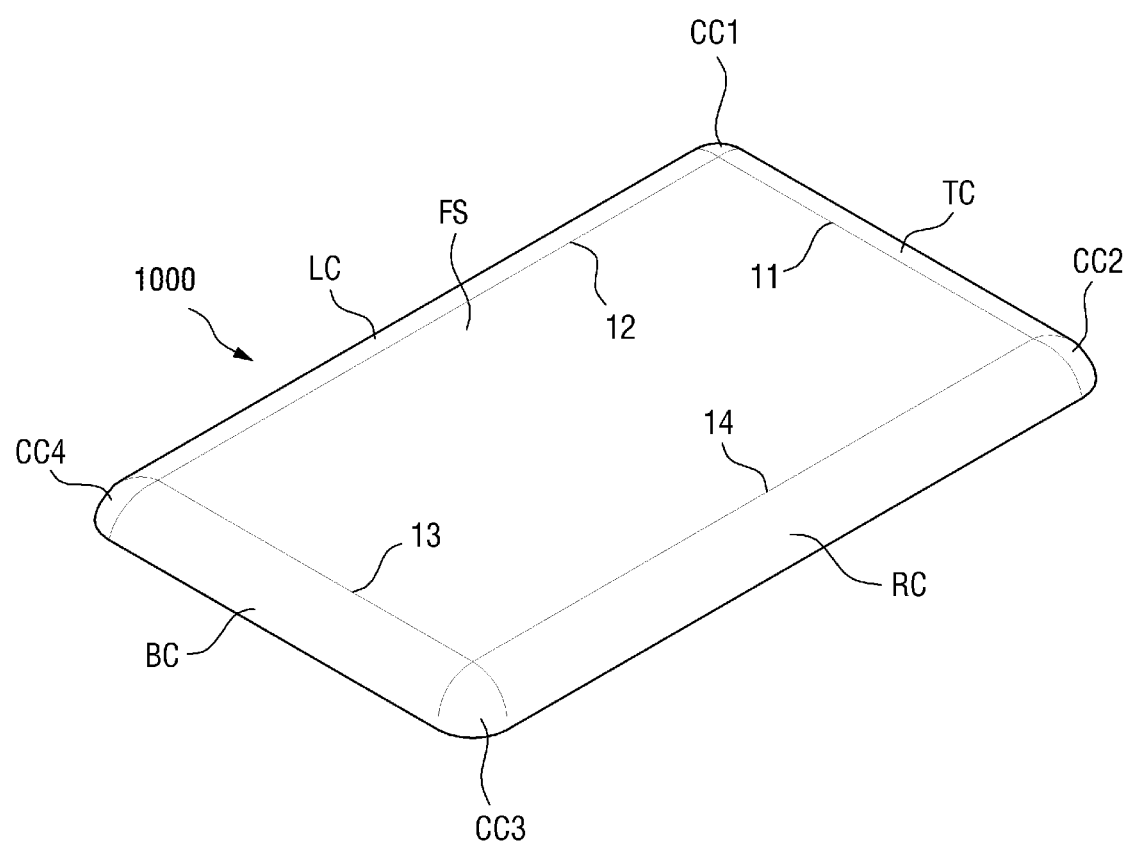
FIG. 1 is a perspective view of an embodiment of a cover window according to the invention.

The advantages and features of the invention and methods for achieving the advantages and features will be apparent by referring to the embodiments to be described in detail with reference to the accompanying drawings. However, the invention is not limited to the embodiments disclosed hereinafter, but can be implemented in diverse forms. The matters defined in the description, such as the detailed construction and elements, are nothing but specific details provided to assist those of ordinary skill in the art in a comprehensive understanding of the invention, and the invention is only defined within the scope of the appended claims.

Where an element is described as being related to another element such as being "on" another element or "located on" a different layer or a layer, includes both a case where an element is located directly on another element or a layer and a case where an element is located on another element via another layer or still another element. In contrast, where an element is described as being is related to another element such as being "directly on" another element or "located directly on" a different layer or a layer, indicates a case where an element is located on another element or a layer with no intervening element or layer therebetween. In the entire description of the invention, the same drawing reference numerals are used for the same elements across various figures.

Although the terms "first, second, and so forth" are used to describe diverse constituent elements, such constituent elements are not limited by the terms. The terms are used only to discriminate a constituent element from other constituent elements. Accordingly, in the following description, a first constituent element may be a second constituent element.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described with reference to the attached drawings.

Figure 2:
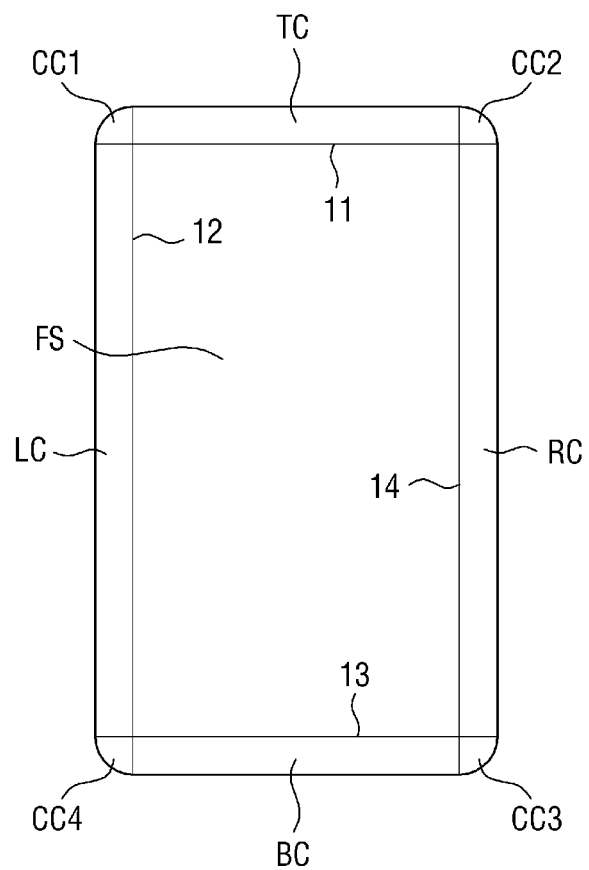
FIG. 2 is a top plan view of the cover window of FIG. 1.

FIG. 1 is a perspective view of an embodiment of a cover window 1000, such as for a display device, according to the invention. FIG. 2 is a top plan view of the cover window 1000 of FIG. 1. The overall cover window 1000 may be disposed in a plane defined by first and second directions which cross each other. A thickness direction of the overall cover window 1000 is extended in a third direction which crosses each of the first and second directions. The first through third directions may be orthogonal to each other, but the invention is not limited thereto.

Referring to FIGS. 1 and 2, the cover window 1000 according to the embodiment includes a flat (surface) portion FS which includes a first side 11 lengthwise extending in a first direction and a second side 12 which contacts the first side 11 and lengthwise extends in a second direction which crosses the first direction, a top curved (surface) portion TC which contacts the first side 11, a left curved (surface) portion LC which contacts the second side 12, and a first corner curved (surface) portion CC1 which connects the top curved surface TC and the left curved surface LC to each other. In a top plan view of the cover window 1000, the first corner curved surface CC1 includes an outer (edge) surface OS (FIG. 3), an inner (edge) surface IS (FIG. 3), a bottom (end) surface BS (FIG. 3) connecting the outer surface OS and the inner surface IS to each other, and a top flat surface as a portion of the flat surface FS. The bottom surface BS may be disposed in a plane parallel to that of the flat surface FS, but the invention is not limited thereto. The bottom surface BS is disposed furthest from the flat surface FS in a thickness direction of the cover window 1000.

The cover window 1000 according to the embodiment may include or be made of a glass or plastic material. However, any transparent material can be used to form the cover window 1000 according to the embodiment.

In an embodiment of manufacturing a display device, the cover window 1000 may be formed by injection molding of a transparent material such as plastic. According to this method, the cover window 1000 having a multi-dimensional shape can be relatively easily formed.

Although a case where the cover window 1000 is a single layer is described herein for ease of description, the cover window 1000 is not limited to the single layer. In an embodiment, the cover window 1000 may be a laminate of a plurality of functional layers.

The flat surface FS is a flat surface and may be transparent. As being a flat surface, the flat surface FS may be disposed in a single plane defined by the first and second directions described above. The transparent flat surface FS may transmit therethrough, an image provided by a display panel 500 (FIG. 14) which will be described later, so that the image can be viewed by a user at the cover window 1000.

In an embodiment, the flat surface FS may have a quadrilateral shape in the top plan view. That is, the flat surface FS may be shaped like a quadrilateral having the first side 11, the second side 12, a third side 13 and a fourth side 14 as four sides.

The first side 11 and the third side 13 may lengthwise extend parallel to each other while facing each other in the second direction, and the second side 12 and the fourth side 14 may lengthwise extend parallel to each other while facing each other in the first direction. In other words, the second side 12 and the fourth side 14 may be lines respectively connecting ends of the first side 11 and the third side 13 facing each other.

In an embodiment, a length of the first side 11 in the first direction may be smaller than a length of the second side 12 in the second direction. That is, the flat surface FS may be shaped like a rectangle having the first side 11 as a relatively short side and the second side 12 as a relatively long side.

In an embodiment, four curved surfaces may respectively extend from the first side 11, the second side 12, the third side 13 and the fourth side 14 of the flat surface FS.

For ease of description, the curved surfaces corresponding to the first side 11, the second side 12, the third side 13 and the fourth side 14 will be referred to as the top curved surface TC, the left curved surface LC, a bottom curved (surface) portion BC, and a right curved (surface) portion RC, respectively.

The top curved surface TC, the left curved surface LC, the bottom curved surface BC and the right curved surface RC may contact the first side 11, the second side 12, the third side 13 and the fourth side 14 of the flat surface FS, respectively. In an embodiment, the first side 11, the second side 12, the third side 13 and the fourth side 14 may include or be made of the same material as and integrally formed with the top curved surface TC, the left curved surface LC, the bottom curved surface BC and the right curved surface RC, respectively. That is, one of the flat surface FS and the collection of curved surfaces TC, LC, BC and RC, may extend to form the other one of the flat surface FS and the collection of curved surfaces TC, LC, BC and RC. In this case, respective boundaries between the first side 11, the second side 12, the third side 13 and the fourth side 14 and the top curved surface TC, the left curved surface LC, the bottom curved surface BC and the right curved surface RC, such as where the elements are connected to each other, may not be visible.

The top curved surface TC, the left curved surface LC, the bottom curved surface BC and the right curved surface RC may be bent in a thickness direction of the cover window 1000, from a side edge of the flat surface FS. That is, each of the top curved surface TC, the left curved surface LC, the bottom curved surface BC, and the right curved surface RC may include or define a bending area of the cover window 1000 that is at least partially bent relative to the plane of the flat surface FS.

The first corner curved surface CC1 may be disposed between the top curved surface TC and the left curved surface LC, and a second curved (surface) portion CC2 may be disposed between the top curved surface TC and the right curved surface RC. A third corner curved (surface) portion CC3 may be disposed between the right curved surface RC and the bottom curved surface BC, and a fourth corner curved (surface) portion CC4 may be disposed between the bottom curved surface BC and the left curved surface LC.

In other words, the first corner curved surface CC1 may connect the top curved surface TC and the left curved surface LC to each other, the second curved surface CC2 may connect the top curved surface TC and the right curved surface RC to each other, the third corner curved surface CC3 may connect the right curved surface RC and the bottom curved surface BC to each other, and the fourth corner curved surface CC4 may connect the bottom curved surface BC and the left curved surface LC to each other.

The first corner curved surface CC1, the second corner curved surface CC2, the third corner curved surface CC3 and the fourth corner curved surface CC4 may have substantially the same shape. The shape may be taken in the top plan view and/or in a cross-sectional view including a thickness direction of the cover window 1000. Therefore, the first corner curved surface CC1 will be mainly described below for ease of description. It should be noted herein that the description of the first corner curved surface CC1 can replace the description of the second corner curved surface CC2, the third corner curved surface CC3 and the fourth corner curved surface CC4.

The first corner curved surface CC1 may be at least partially bent. A side (edge) of the first corner curved surface CC1 may contact the top curved surface TC at a first side edge thereof, and a second side edge of the first corner curved surface CC1 opposite to the first side edge thereof may contact the left curved surface LC.

In an embodiment, the first corner curved surface CC1 may be integrally formed with the top curved surface TC and the left curved surface LC. That is, one of the first corner curved surface CC1, the top curved surface TC and the left curved surface LC may extend to form another one of the first corner curved surface CC1, the top curved surface TC and the left curved surface LC. In this case, a boundary between the first corner curved surface CC1 and the top curved surface TC, and a boundary between the first corner curved surface CC1 and the left curved surface LC, may not be visible.

The first corner curved surface CC1 may include or be formed by the outer (side) surface OS viewed from the angles of FIGS. 1 and 2, the inner (side) surface IS located opposite the outer surface OS, and the bottom surface BS connecting the outer surface OS and the inner surface IS to each other.

The cover window 1000 according to the embodiment will now be described with reference to FIGS. 3 through 7.

Figure 3:
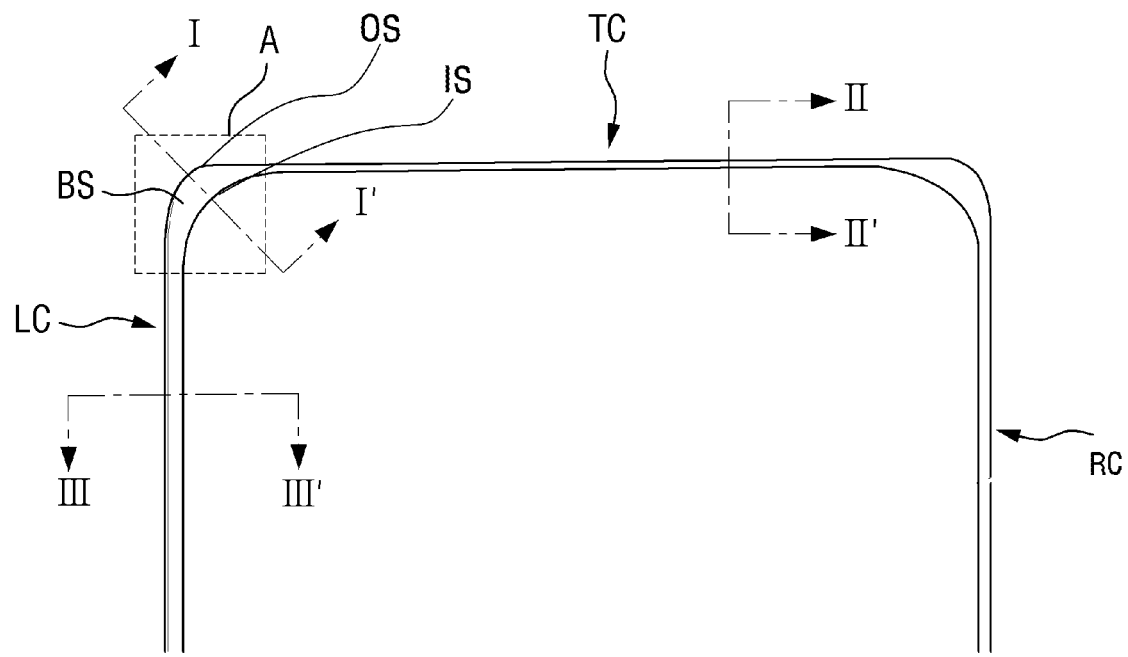
FIG. 3 is a partial top plan view of the cover window of FIG. 1.
Figure 4:
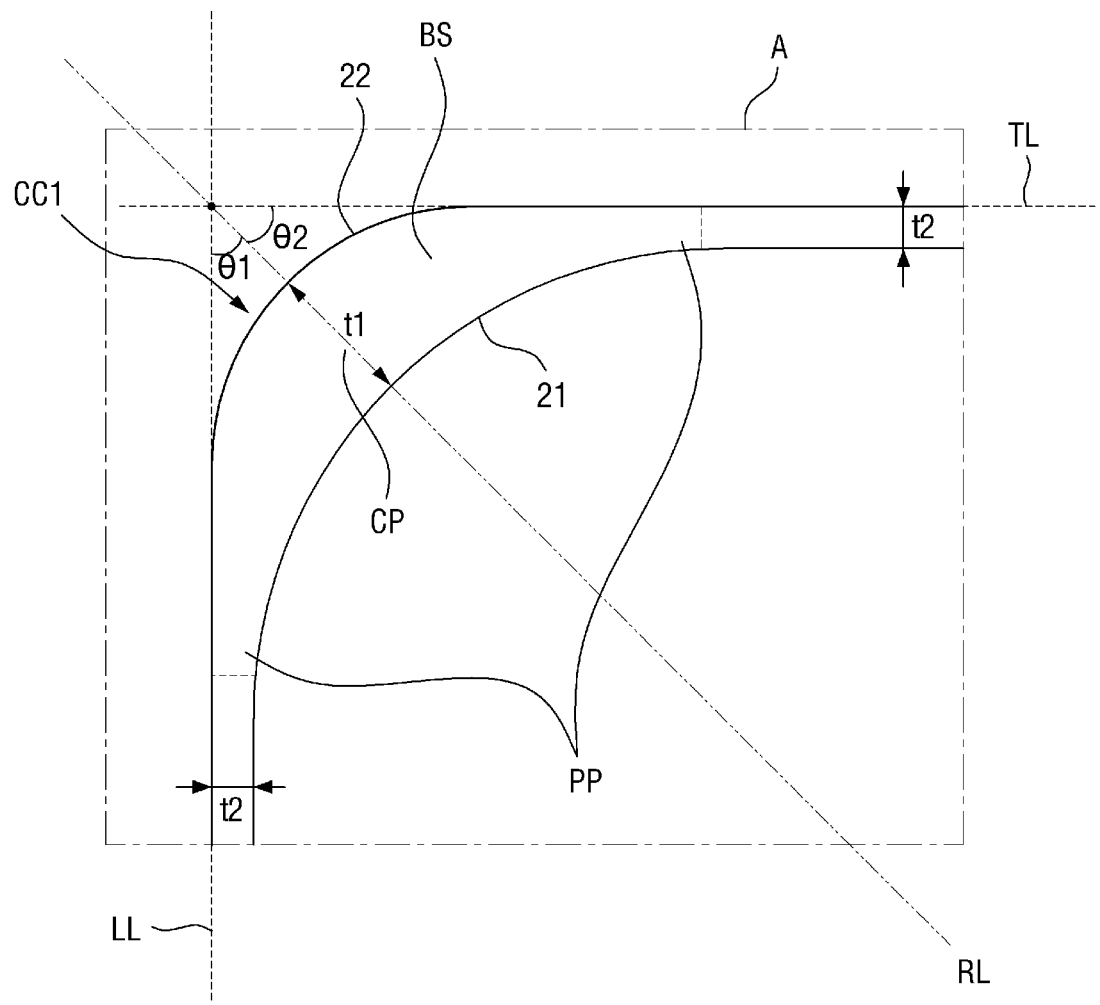
FIG. 4 is an enlarged top plan view of a portion 'A' of FIG. 3.
Figure 5:
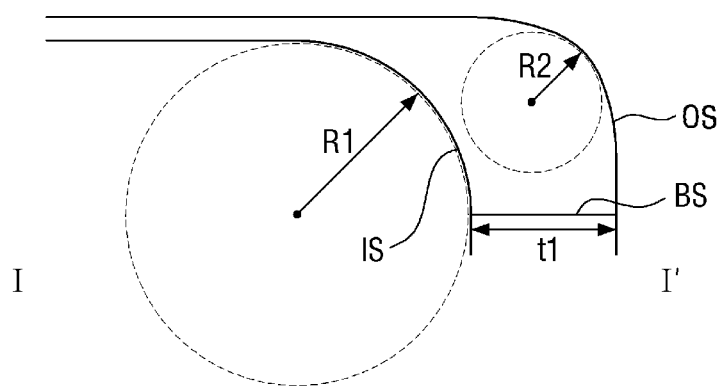
FIG. 5 is a cross-sectional view of the portion 'A'; taken along line I-I' of FIG. 3.
Figure 6:
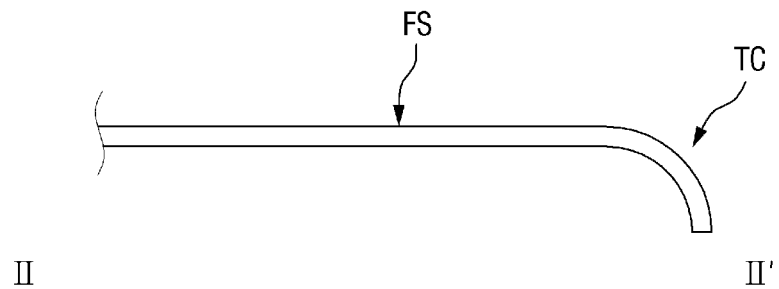
FIG. 6 is a cross-sectional view taken along line II-II' of FIG. 3.
Figure 7:
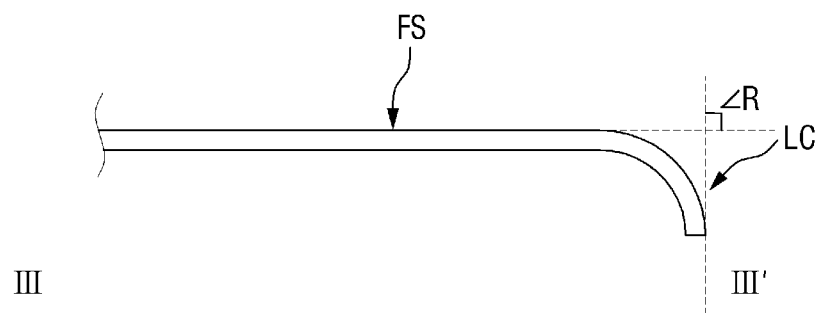
FIG. 7 is a cross-sectional view taken along III-III' of FIG. 3.

FIG. 3 is a partial top plan view of the cover window 1000 according to the embodiment. FIG. 4 is an enlarged top view of a portion 'A' of FIG. 3. FIG. 5 is a cross-sectional view taken along line I-I' of FIG. 3. FIG. 6 is a cross-sectional view taken along line II-II' of FIG. 3. FIG. 7 is a cross-sectional view taken along line III-III' of FIG. 3.

In FIG. 4, the bottom surface BS of the first corner curved surface CC1 of the cover window 1000 is illustrated.

The bottom surface BS may connect the outer surface OS and the inner surface IS of the first corner curved surface CC1, to each other. Referring to FIG. 4, a first boundary 21 may be defined between the bottom surface BS and the inner surface IS of the first corner curved surface CC1, and a second boundary 22 may be defined between the bottom surface BS and the outer surface OS of the first corner curved surface CC1. That is, the bottom surface BS may be a surface disposed extended between the first boundary 21 and the second boundary 22, at a rear side of the cover window 1000.

In an embodiment, the first boundary 21 may have a parabolic shape that is convex toward the outer surface OS relative to the flat surface FS.

The bottom surface BS may include a central portion CP having a relatively large width and a peripheral portion PP having a relatively small width. The central portion CP may be disposed at the center of the bottom surface BS and may have a first width t1.

For ease of description, some terms will be defined below. In order to define the first width t1, the concept of a reference line RL will be defined first.

The reference line RL may extend from a point where a first extension line LL, which is a longitudinal (virtual) extension line of a side of the left curved surface LC, and a second extension line TL, which is a longitudinal (virtual) extension line of a side of the top curved surface TC, meet.

In an embodiment, the reference line RL may extend at a first angle θ1 to the first extension line LL and at a second angle θ2 to the second extension line TL.

In an embodiment, the first angle θ1 and the second angle θ2 may be equal.

In an embodiment, the first extension line LL and the second extension line TL may be at a right angle to each other. In this case, both the first angle θ1 and the second angle θ2 may be 45 degrees.

In an embodiment, the first width t1 may be the distance of a line segment connecting a point at which the reference line RL meets the first boundary 21 and a point at which the reference line RL meets the second boundary 22.

The central portion CP of the bottom surface BS may be a portion where the first width t1 is defined, and the peripheral portion PP may be a portion disposed extended from each of opposing sides of the central portion CP, along a respective extension line.

In an embodiment, the bottom surface BS may be widest at the central portion CP and thinnest at an outermost portion of the peripheral portion PP, such as along the sides of the flat surface FS. In other words, the central portion CP may have the first width t1, and the outermost portion of the peripheral portion PP may have a second width t2. The first width t1 may be a maximum width of the bottom surface BS and the second width t2 may be a minimum width of the bottom surface, among widths of the overall bottom surface at the first corner curved surface CC1. Said in another way, in the top plan view, widths of the bottom surface BS may be taken in a direction normal to the first boundary 21, along the shape (length) of the first boundary 21.

That is, in the top plan view, the width of the bottom surface BS may gradually decrease from the central portion CP toward the peripheral portion PP.

When the width of the bottom surface BS gradually decreases from the central portion CP toward the peripheral portion PP, the planar area of the inner surface IS of the first corner curved surface CC1, exposed at the rear side of the cover window 1000, is relatively small as compared with when the width of the bottom surface BS is uniform.

Various film-like components including a colored film which will be described later may be disposed inside the cover window 1000 according to the embodiment. These components may be attached to the cover window 1000. When a flat film-like component is attached to the cover window 1000, it may crease on a curved portion of the cover window 1000, and the creases may be undesirably visible from the outside.

However, if the planar area of the inner surface IS of the first corner curved surface CC1 is reduced as described above, the planar area of the curved portion to which the flat film is attached is reduced. This can minimize creases formed in the flat film-like component during the attachment process.

Referring to FIG. 5, the curvature of the outer surface OS and the curvature of the inner surface IS in cross-section may be different from each other. FIG. 5 is a cross-sectional view taken along line I-I' of FIG. 3. The line I-I' may overlap or be aligned with the reference line RL of FIG. 4. In this case, the bottom surface BS may have the first width t1 as illustrated in FIG. 5.

In an embodiment, each of the inner surface IS and the outer surface OS of the first corner curved surface CC1 may include a curved surface in cross-section.

Specifically, the inner surface IS may include a curved surface having a first radius of curvature R1, and the outer surface OS may include a curved surface having a second radius of curvature R2. The radius of curvature may be a portion of a virtual circle shape (dotted circle) which defines a cross-sectional profile of the respective inner or outer surface.

In an embodiment, the first radius of curvature R1 may be greater than the second radius of curvature R2. In other words, the curvature of the inner surface IS may be smaller than the curvature of the outer surface OS. With the different radii of curvature at the first corner curved surface, a thickness of the cover window 1000 taken from the inner surface IS to the outer surface OS, in a direction normal to various points along the inner surface IS, is varied. Such thickness may be maximum at the reference line RL, and may decrease at points along the inner surface IS away from the center portion CP toward the peripheral portion PP. The thickness of the cover window 1000 may be minimal at the top, bottom, left side and right side surfaces TC, BC, LC and RC.

The small curvature of the inner surface IS may denote that the inner surface IS is curved relatively gently compared with the outer surface OS. As described above, a film-like component can be attached to the cover window 1000 according to the embodiment. When the inner surface IS exposed at the rear side of the cover window 1000 is curved relatively gently compared with the outer surface OS, the film-like component can be attached to the cover window 1000, at a gradual angle or curve. This can minimize creasing of the film on the first corner curved surface CC1.

FIG. 6 illustrates the flat surface FS and the top curved surface TC in cross-section. Although not labeled, each of the flat surface FS and the top curved surface TC may also include an outer surface, an inner surface, and a bottom surface, similar to those indicated in FIG. 5.

In an embodiment, the flat surface FS and the top curved surface TC may have the same thickness, taken from the inner surface to the outer surface. The radii of curvature of the inner and outer surfaces, at the top curved surface TC of the cover window 1000, may be the same, but the invention is not limited thereto.

In an embodiment, for either the inner surface or the outer surface, an angle formed by an extension line of the flat surface FS and an extension line of top curved surface TC in cross-section may be 90 degrees, but the invention is not limited thereto. In other words, a plane in which the flat surface FS is disposed and a plane in which the outer surface OS at the end of the top curved surface TC is disposed, may form an angle of about 90 degrees, but the invention is not limited thereto.

In FIG. 6, only the top curved surface TC is illustrated. However, the bottom curved surface BC may also have the same thickness as the flat surface FS, taken from the inner surface to the outer surface.

FIG. 7 illustrates the flat surface FS and the left curved surface LC in cross-section. Although not labeled, each of the flat surface FS and the left curved surface LC may also include an outer surface, an inner surface, and a bottom surface, similar to those indicated in FIG. 5.

In an embodiment, the flat surface FS and the left curved surface LC may have the same thickness, taken from the inner surface to the outer surface. The radii of curvature of the inner and outer surfaces, at the left curved surface LC of the cover window 1000, may be the same, but the invention is not limited thereto.

In an embodiment, an angle formed by an extension line of the flat surface FS and an extension line of the left curved surface LC may be about 90 degrees (<R). The extension line may be of the inner or outer surfaces. In other words, a plane in which the flat surface FS is disposed and a plane in which the outer surface OS at the end of the left curved surface LC is disposed, may form an angle of about 90 degrees, but the invention is not limited thereto.

In FIG. 7, only the left curved surface LC is illustrated. However, the right curved surface RC may also have the same thickness as the flat surface FS, taken from the inner surface to the outer surface.

Hereinafter, cover windows according to other embodiments will be described. Some of the components described below may be substantially the same as those of the cover window 1000 according to the above-described embodiment, and descriptions of some components will be omitted in order to avoid redundancy.

Figure 8:
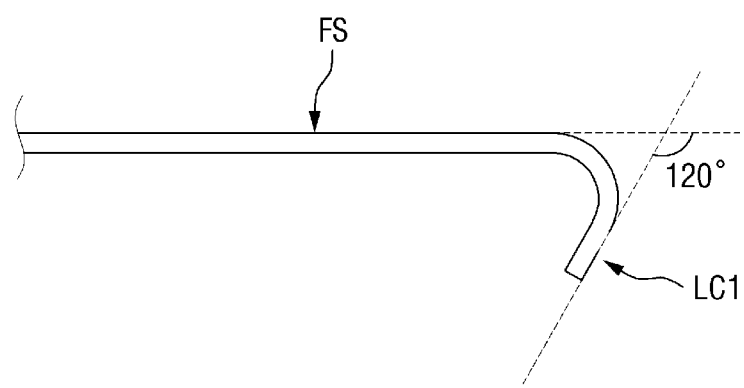
FIG. 8 is a partial cross-sectional view of a modified embodiment of a cover window according to the invention.

FIG. 8 is a partial cross-sectional view of a cover window according to an embodiment. FIG. 8 is a modified embodiment of FIG. 7.

In an embodiment, an angle formed by an extension line of a flat surface FS and an extension line of an end of a left curved surface LC1 may be about 120 degrees (°). The extension line may be of the inner or outer surfaces. In other words, a plane in which the flat surface FS is disposed and a plane in which the outer surface OS at the end of the left curved surface LC1 is disposed, may form an angle of about 120 degrees, but the invention is not limited thereto.

Although only the left curved surface LC1 is illustrated in FIG. 8, a right curved surface may also have the same shape as the left curved surface LC1 as described above.

Figure 9:
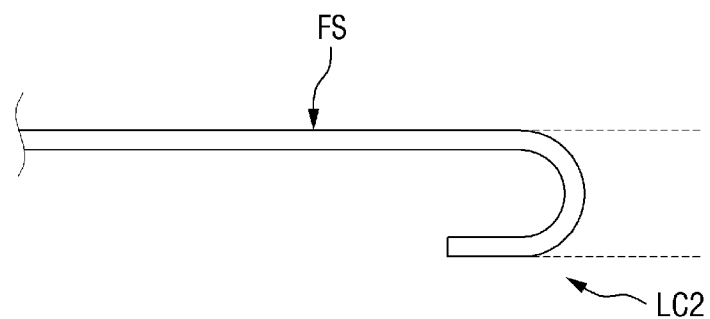
FIG. 9 is a partial cross-sectional view of another modified embodiment of a cover window according to the invention.

FIG. 9 is a partial cross-sectional view of a cover window according to an embodiment. FIG. 9 is another modified embodiment of FIG. 7.

In an embodiment, an extension line of a flat surface FS and an extension line of a left curved surface LC2 may be parallel to each other. That is, the extension line of the flat surface FS and the extension line of an end (e.g., at the distal end) of the left curved surface LC2 may be spaced apart from each other and may not meet. The extension line may be of the inner or outer surfaces. In other words, a plane in which the flat surface FS is disposed and a plane in which the outer surface OS at the end of the left curved surface LC2 is disposed, may be parallel to each other, but the invention is not limited thereto.

In FIG. 9, only the left curved surface LC2 is illustrated. However, a right curved surface may also have the same shape as the left curved surface LC2 as described above.

Figure 10:
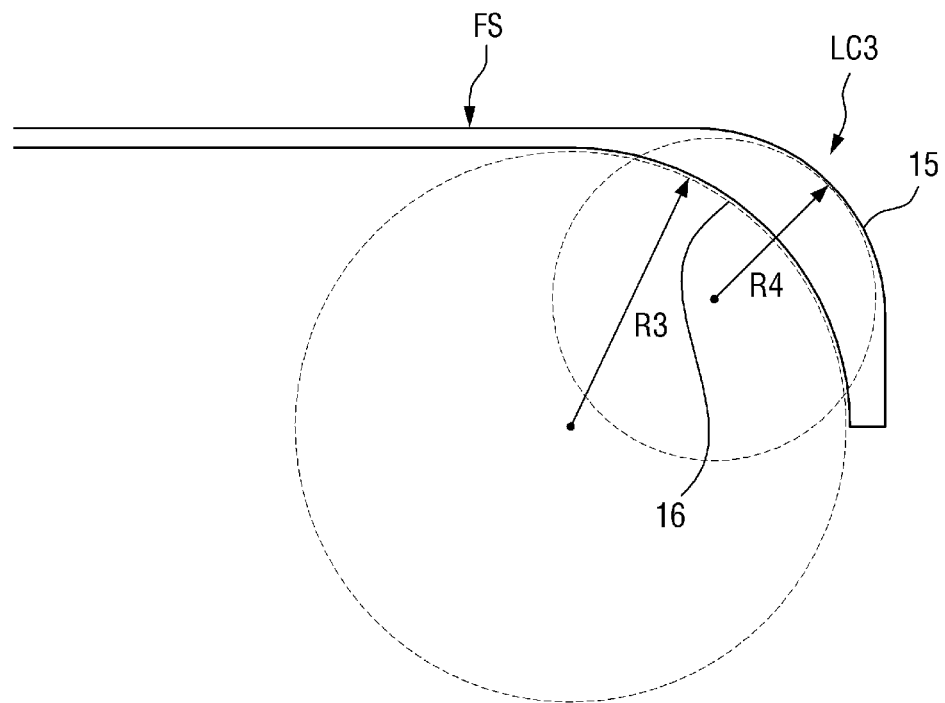
FIG. 10 is a partial cross-sectional view of still another modified embodiment of a cover window according to the invention.

FIG. 10 is a partial cross-sectional view of a cover window according to an embodiment. FIG. 10 is still another modified embodiment of FIG. 7.

Referring to FIG. 10, an outer wall 15 and an inner wall 16 of a left curved surface LC3 of the cover window 1000 may have different curvatures. The outer wall 15 and the inner wall 16 may correspond to the (unlabeled) inner surface and (unlabeled) outer surface discussed above for FIGS. 6-8.

Specifically, the inner wall 16 of the left curved surface LC3 may include a curved surface having a third radius of curvature R3, and the outer wall 15 may include a curved surface having a fourth radius of curvature R4.

In an embodiment, the third radius of curvature R3 may be greater than the fourth radius of curvature R4. In other words, the curvature of the curved surface at the inner wall 16 may be smaller than the curvature of the curved surface at the outer wall 15.

This may indicate that the inner wall 16 is curved relatively gently compared with the outer wall 15. As described above, a film-like component can be attached to the cover window 1000 according to the embodiment. If the inner wall 16 exposed at the rear side of the cover window 1000 is curved relatively gently compared with the outer wall 15, the film-like component can be attached to the cover window 1000, at a gradual angle or curve. This can minimize creasing of the film on the curved surface.

In FIG. 10, the left curved surface LC3 is illustrated. However, a right curved surface may also have substantially the same shape as the left curved surface LC3.

The embodiment of FIG. 10 is also applicable to a top curved surface TC or a bottom curved surface BC of the cover window 1000. In other words, in an embodiment, an inner wall (not illustrated) and an outer wall (not illustrated) of the top curved surface TC or the bottom curved surface BC may have different curvatures as illustrated in FIG. 10. That is, the curvature of an inner surface may be smaller than that of an outer surface.

Figure 11:
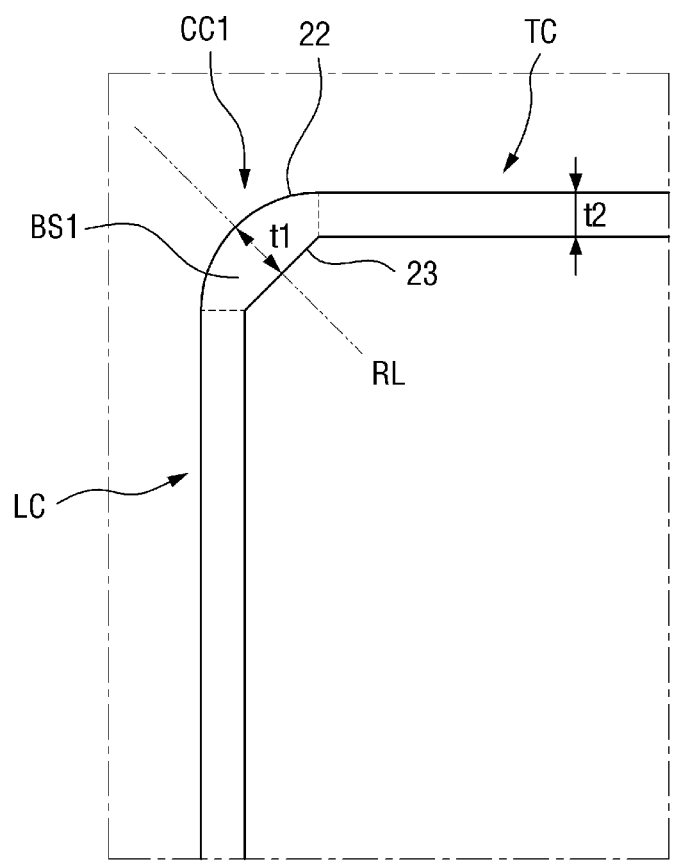
FIG. 11 is a partial top plan view of a yet another modified embodiment of a cover window according to the invention.

FIG. 11 is a partial top plan view of yet another modified embodiment of a cover window according to the invention.

Referring to FIG. 11, the current embodiment is different from the embodiment of FIG. 4 in that a first boundary 23 between a bottom surface BS1 and an inner surface IS is a straight line, instead of a curved line.

In an embodiment, the first boundary 23 between the bottom surface BS1 and the inner surface IS may be a straight line. Even in this case, a central portion of the bottom surface BS1 may have a first width t1, and a peripheral portion may have a second width t2. That is, as described above with reference to FIG. 4, the width of the bottom surface BS1 may gradually decrease from the central portion toward the peripheral portion.

Figure 12:
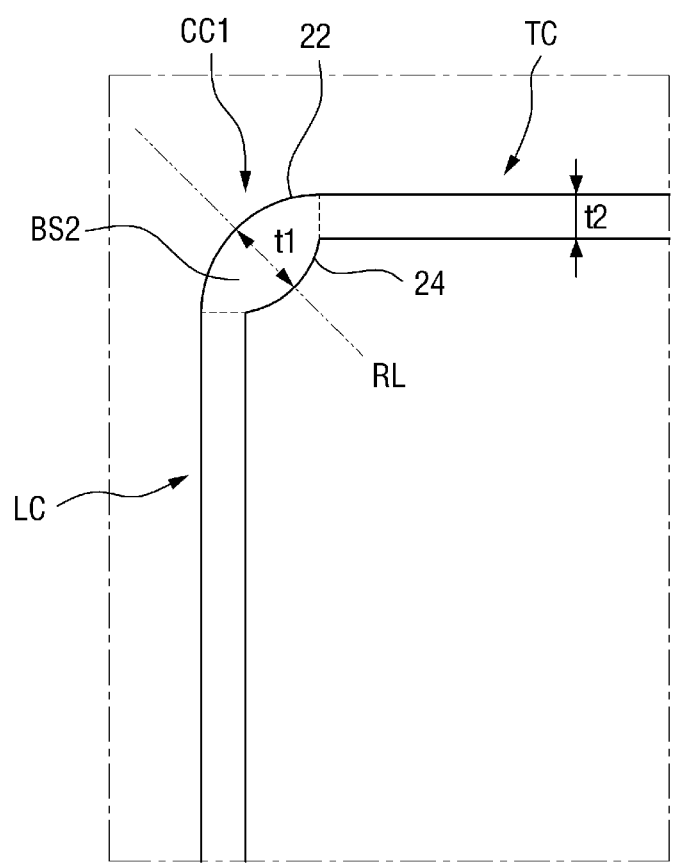
FIG. 12 is a partial top plan view of yet another modified embodiment of a cover window according to the invention.

FIG. 12 is a partial plan top view of a yet another modified embodiment of a cover window according to the invention. Referring to FIG. 12, the current embodiment is different from the embodiment of FIG. 4 in that a first boundary 24 between a bottom surface BS2 and an inner surface IS is a curve convex toward the center of a flat surface FS of the cover window 1000, relative to the outer surface of the first corner curved surface.

In an embodiment, the first boundary 24 between the bottom surface BS2 and the inner surface IS may be a parabola that is convex toward the center of the cover window 1000, relative to the outer surface OS (FIG. 5) of the first corner curved surface.

Even in this case, a central portion of the bottom surface BS2 may have a first width t1, and a peripheral portion may have a second width t2. That is, as described above with reference to FIG. 4, the width of the bottom surface BS2 may gradually decrease from the central portion toward the peripheral portion.

Figure 13:
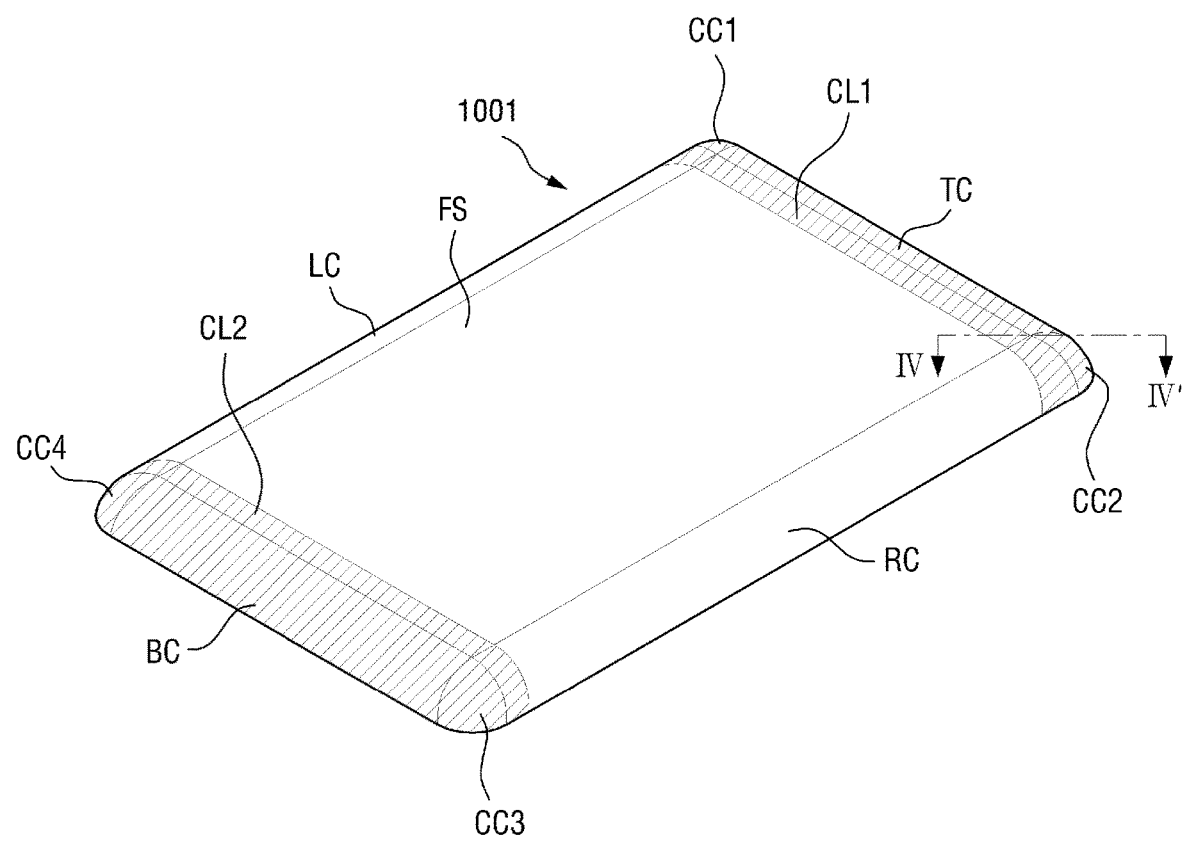
FIG. 13 is a perspective view of another embodiment of a cover window according to the invention.

FIG. 13 is a perspective view of another embodiment of a cover window 1001 according to an embodiment. Referring to FIG. 13, the cover window 1001 according to the embodiment is different from the embodiment of FIG. 1 in that it further includes colored films (CL1 and CL2).

In an embodiment, a first colored film CL1 and a second colored film CL2 may be attached to the cover window 1001. The first and second colored films CL1 and CL2 may be attached to an inner surface (or inner wall) of the cover window 1001 and/or the outer surface (or outer wall) of the cover window 1001.

The first colored film CL1 and the second colored film CL2 may block light, such as that light used by a display panel to generate and display an image. Therefore, no image may be displayed at areas of the cover window 1001 to which the first colored film CL1 and the second colored film CL2 are attached.

Each of the first colored film CL1 and the second colored film CL2 may be black in color or may include a light absorbing color, such that light is blocked.

In an embodiment, the first colored film CL1 and the second colored film CL2 may include or be made of polyethylene terephthalate ("PET"). However, the materials of the first colored film CL1 and the second colored film CL2 are not limited to the PET.

In an embodiment, the first colored film CL1 may overlap a top curved surface TC, a first corner curved surface CC1, and a second corner curved surface CC2. Accordingly, the top curved surface TC, the first corner curved surface CC1, and the second corner curved surface CC2 may be areas that do not display an image.

The second colored film CL2 may overlap a bottom curved surface BC, a third corner curved surface CC3, and a fourth corner curved surface CC4. Accordingly, the bottom curved surface BC, the third corner curved surface CC3, and the fourth corner curved surface CC4 may be areas that do not display an image.

In an embodiment, each of the first colored film CL1 and the second colored film CL2 may partially overlap a flat surface FS, a left curved surface LC, and a right curved surface RC.

In this case, a portion of the flat surface FS, a portion of the left curved surface LC and a portion of the right curved surface RC which overlap the first colored film CL1 and the second colored film CL2 may block light to not display an image therewith, and a portion of the flat surface FS, a portion of the left curved surface LC and a portion of the right curved surface RC which do not overlap the first colored film CL1 and the second colored film CL2 may transmit the light to display an image therewith.

In an embodiment, the first colored film CL1 and the second colored film CL2 may be attached to the cover window 1001. The first colored film CL1 and the second colored film CL2 may have a different shape from the cover window 1001, especially at curved portions thereof, and this difference in shape may cause the first colored film CL1 and the second colored film CL2 to crease in the attachment process. Such creasing is particularly prone to occur at corner portions.

When one or more of the structures according to some embodiments of the cover window described above are adopted, the area of a portion to which each of the first colored film CL1 and the second colored film CL2 is attached can be minimized, or the first colored film CL1 and the second colored film CL2 can be attached to such area at a gradual angle or curve. This can minimize creasing of the first colored film CL1 and the second colored film CL2 at the corner portions.

Figure 14:
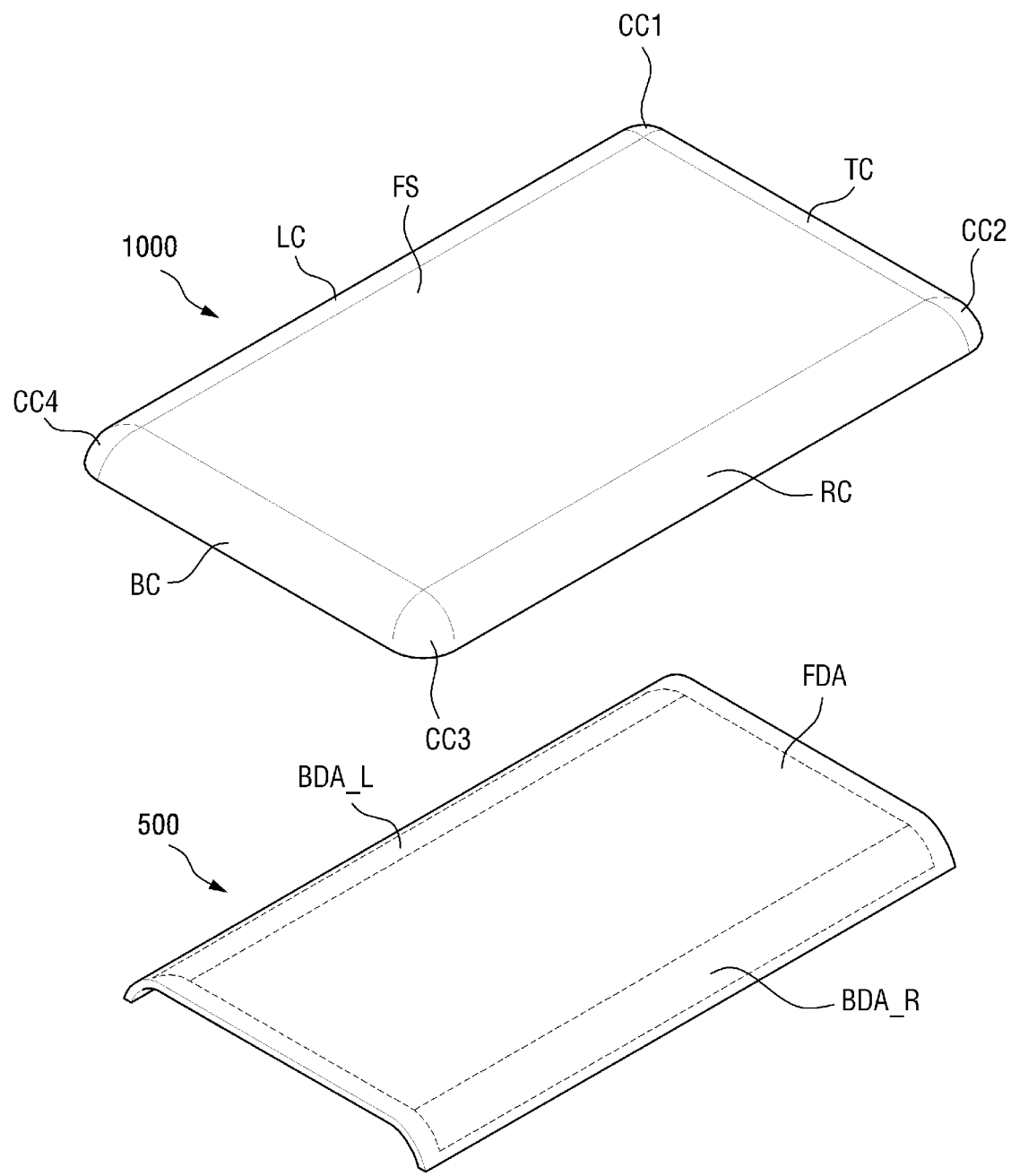
FIG. 14 is a perspective view of an embodiment of a display device according to the invention.

FIG. 14 is a perspective view of an embodiment of a display device according to the invention. Referring to FIG. 14, the display device according to the embodiment includes a display panel 500 and a cover window 1000 disposed on the display panel 500. The display panel 500 may be disposed at an inner surface (or inner wall) of the cover window 1000. The cover window 1000 forms an outermost surface of the display device, such as at a viewing side thereof.

The cover window 1000 indicated in FIG. 14 may be substantially the same as the window which is described above embodiments. It will be understood that the cover window 1001 of FIG. 13 may be used as the cover window in the display device of FIG. 14.

The display panel 500 may display an image with light. In an embodiment, the display panel 500 may be an organic light emitting display. However, the display panel 500 which displays an image with light can also include various types of display panels currently existing or expected to exist depending on future technological developments.

In an embodiment, the display panel 500 may be a flexible display device that can bent, folded or rolled.

In an embodiment, the display panel 500 may include or define a display area at which an image is displayed, and a non-display area at which the image is not displayed. Light may be transmitted at the display area, where light is blocked at the non-display area. One or more embodiment of the cover window described above may transmit the light at the display area of the display panel 500 or may block the light at the non-display area of the display panel 500.

In an embodiment, the display area may include a flat display area FDA and a left curved display area BDA_L and a right curved display area BDA_R disposed on both sides of the flat display area FDA. The non-display area may be a remaining area of the display panel 500 except for the display areas, such as outside of the dotted lines indicated in FIG. 14.

The left curved display area BDA_L and the right curved display area BDA_R may face each other with respect to the flat display area FDA, and may at least partially include a curved surface.

The left curved display area BDA_L and the right curved display area BDA_R may correspond to a left curved surface LC and a right curved surface RC of the cover window 1000, respectively. That is, the left curved display area BDA_L and the right curved display area BDA_R may overlap the left curved surface LC and the right curved surface RC of the cover window 1000, respectively.

In this case, an image provided from the left curved display area BDA_L may be displayed at or through the left curved surface LC, and an image provided from the right curved display area BDA_R may be displayed at or through the right curved surface RC.

The flat display area FDA may correspond to a flat surface FS of the cover window 1000. In other words, the flat display area FDA may overlap the flat surface FS of the cover window 1000. In this case, an image provided from the flat display area FDA may be displayed at or through the flat surface FS. The flat surface FS of the cover window 1000 may define a front surface of the overall display device. In similar fashion, a left curved surface LC, a right curved surface RC, a top curved surface TC and a bottom curved surface BC of the cover window 1000 defines side surfaces of the overall display device.

In FIG. 14, only the cover window 1000 and the display panel 500 are illustrated as components of the display device. However, components of the display device are not limited to the cover window 1000 and the display panel 500.

In embodiments of a display device, a plurality of functional layers such as a polarizing layer, an adhesive layer and an input sensing unit may be disposed between the cover window 1000 and the display panel 500. However, these functional layers are mere examples, and the types of the functional layers are not limited to the above examples. In order to make the invention clear, a detailed description of the functional layers will be omitted. Although the description of the functional layers is omitted, it should be noted that components that can be disposed between the display panel 500 and the cover window 1000 in the display device can also be provided in display devices according to embodiments.

Figure 15:
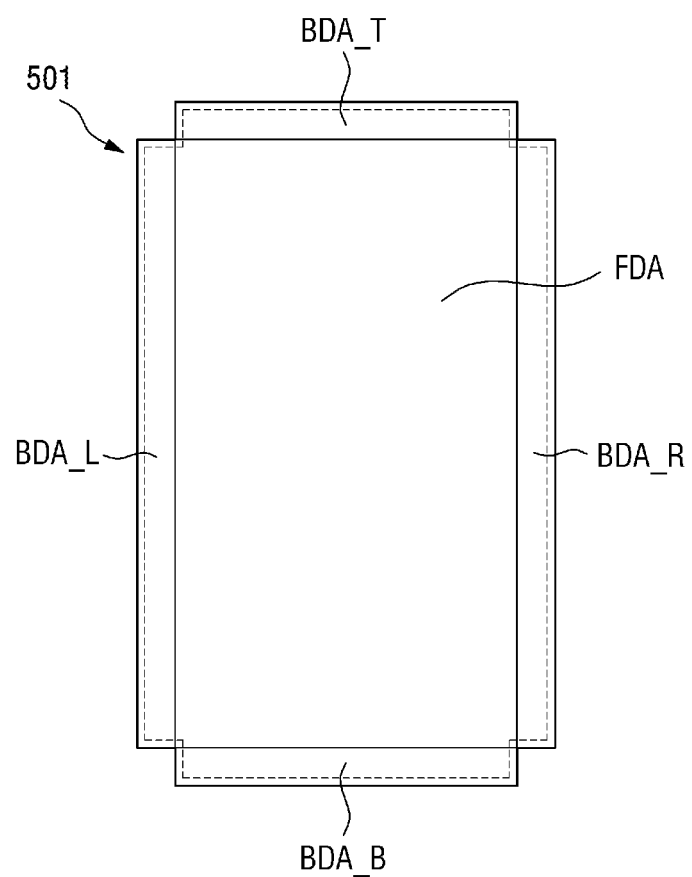
FIG. 15 is a partial top plan view of modified embodiment of a display device according to the invention.

FIG. 15 is a partial top plan view of a modified embodiment of a display device according to the invention. In FIG. 15, a display panel 501 included in the display device according to the embodiment is illustrated. For convenience of illustration, portions of the cover window indicated in FIG. 14 are omitted in FIG. 15.

In an embodiment, the display panel 501 may include a flat display area FDA and four (sub) display areas surrounding the flat display area FDA, that is, a left curved (sub) display area BDA_L, a right curved (sub) display area BDA_R, a top curved (sub) display area BDA_T and a bottom curved (sub) display area BDA_B. A total display area of the display panel 501 is indicated by dotted lines in FIG. 15.

The flat display area FDA may correspond to a flat surface FS of a cover window 1000 according to embodiments. That is, an image provided from the flat display area FDA may be displayed at or through the flat surface FS.

The left curved display area BDA_L, the right curved display area BDA_R, the top curved display area BDA_T and the bottom curved display area BDA_B may correspond to a left curved surface LC, a right curved surface RC, a top curved surface TC and a bottom curved surface BC of the cover window 1000 according to the embodiments, respectively.

That is, an image provided from the left curved display area BDA_L may be displayed at or through the left curved surface LC, an image provided from the right curved display area BDA_R may be displayed at or through the right curved surface RC, an image provided from the top curved display area BDA_T may be displayed at or through the top curved surface TC, and an image provided from the bottom curved display area BDA_B may be displayed at or through the bottom curved surface BC.

Figure 16:
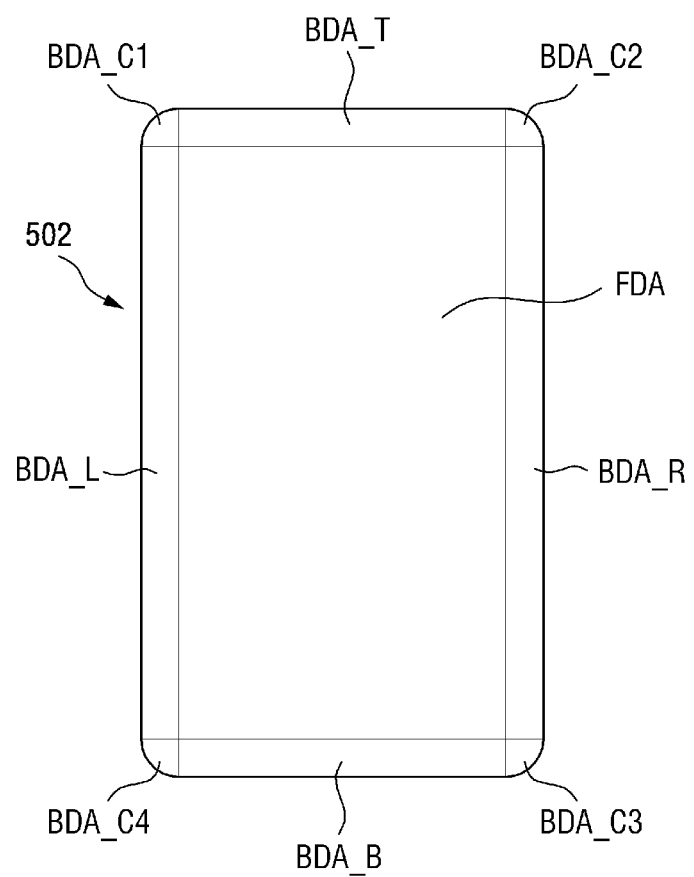
FIG. 16 is a partial top plan view of another modified embodiment of a display device according to the invention.

FIG. 16 is a partial plan view of another modified embodiment of a display device according to the invention. Referring to FIG. 16, the display device according to the current embodiment is different from the embodiment of FIG. 15 in that a display panel 502 further includes a first corner (sub) display area BDA_C1, a second corner (sub) display area BDA_C2, a third corner (sub) display area BDA_C3, and a fourth corner (sub) display area BDA_C4.

A flat display area FDA and four (sub) display areas surrounding the flat display area FDA, that is, a left curved display area BDA_L, a right curved display area BDA_R, a top curved display area BDA_T, and a bottom curved display area BDA_B are substantially the same as those described above with reference to FIG. 15, and thus a detailed description of them will be omitted.

The display device according to the current embodiment may further include the first corner display area BDA_C1, the second corner display area BDA_C2, the third corner display area BDA_C3, and the fourth corner display area BDA_C4, disposed adjacent to the flat display area FDA in a diagonal direction (e.g., direction inclined with respect to the first and second directions).

Each of the first corner display area BDA_C1, the second corner display area BDA_C2, the third corner display area BDA_C3, and the fourth corner display area BDA_C4 may include a curved surface.

Along an overall perimeter of the display panel 502, the first corner display area BDA_C1 may be disposed between the top curved display area BDA_T and the left curved display area BDA_L, the second corner display area BDA_C2 may be disposed between the top curved display area BDA_T and the right curved display area BDA_R, the third corner display area BDA_C3 may be disposed between the right curved display area BDA_R and the bottom curved display area BDA_B, and the fourth corner display area BDA_C4 may be disposed between the bottom curved display area BDA_B and the left curved display area BDA_L.

In an embodiment, with respect to corner curved surfaces of a cover window; the first corner display area BDA_C1 may correspond to a first corner curved surface CC1, the second corner display area BDA_C2 may correspond to a second corner curved surface CC2, the third corner display area BDA_C3 may correspond to a third corner curved surface CC3, and the fourth corner display area BDA_C4 may correspond to a fourth corner curved surface CC4.

That is, an image provided from the first corner display area BDA_C1 may be displayed at or through the first corner curved surface CC1, an image provided from the second corner display area BDA_C2 may be displayed at or through the second corner curved surface CC2, an image provided from the third corner display area BDA_C3 may be displayed at or through the third corner curved surface CC3, and an image provided from the fourth corner display area BDA_C4 may be displayed at or through the fourth corner curved surface CC4.

When the display panel has a plurality of curved display areas as described above, the total area of the display panel at which an image is displayed in a display device having curved surfaces, can be increased. Therefore, a display device displaying various images can be realized.

One or more embodiment of the invention provides at least one of the following advantages.

It is possible to suppress the formation of an attachment defect at corner portions of a cover window, from attachment of a film or layer to the cover window.

However, the effects of the invention are not restricted to the one set forth herein. The above and other effects of the invention will become more apparent to one of daily skill in the art to which the invention pertains by referencing the claims.

While the invention has been particularly illustrated and described with reference to exemplary embodiments thereof, it will be understood by those of ordinary skill in the art that various changes in form and detail may be made therein without departing from the spirit and scope of the invention as defined by the following claims. The exemplary embodiments should be considered in a descriptive sense only and not for purposes of limitation.

What is claimed is:
1. A cover window comprising:
   a flat portion which defines a front outer surface of a display device, the flat portion comprising in a top plan view, a first side extending in a first direction and a second side which contacts the first side and extends in a second direction different from the first direction;
   a top curved portion which contacts the first side of the flat portion and extends from the first side in the second direction;
   a left curved portion which contacts the second side of the flat portion and extends from the second side in the first direction; and
   a first corner curved portion which connects the top curved portion and the left curved portion to each other,
   wherein
   in cross-section, the first corner curved portion comprises:
      an outer surface, an inner surface, and a bottom end surface connecting the outer surface thereof and the inner surface thereof to each other, and
   in the top plan view,
      a width of the bottom end surface of the first corner curved portion, is taken from the inner surface to the outer surface, and
      the width of the bottom end surface of the first corner curved portion decreases in a direction away from a central portion of the first corner curved portion.
2. The cover window of claim 1, wherein
   in the cross-section, the inner surface of the first corner curved portion has a first radius of curvature, and the outer surface of the first corner curved portion has a second radius of curvature which is different from the first radius of curvature, and a thickness of the first corner curved portion varies in a direction from the flat portion to the bottom end surface.

3. The cover window of claim 1, wherein a thickness of the flat portion is the same as a thickness of each of the top curved portion and the left curved portion.

4. The cover window of claim 1, wherein
the left curved portion comprises an outer surface, an inner surface, and a bottom end surface connecting the outer surface thereof and the inner surface thereof to each other, and
in the cross section, the outer surface of the left curved portion at the bottom end surface thereof forms an angle of about 90 degrees with the flat portion.

5. The cover window of claim 1, wherein
the left curved portion comprises an outer surface, an inner surface, and a bottom end surface connecting the outer surface thereof and the inner surface thereof to each other, and
in the cross-section, the outer surface of the left curved portion at the bottom end surface thereof forms an angle of about 120 degrees with the flat portion.

6. The cover window of claim 1, wherein in the cross-section, an extension line of the flat portion and an extension line of an end of the left curved portion are parallel to each other.

7. The cover window of claim 1, wherein in the cross-section,
each of the left curved portion and the top curved portion comprises an outer surface, an inner surface, and a bottom end surface connecting the outer surface thereof and the inner surface thereof to each other,
the inner surface of the left curved portion has a third radius of curvature, and
the outer surface of the left curved portion has a fourth radius of curvature which is different from the third radius of curvature,
wherein a thickness of the left curved portion varies in a direction from the flat portion to the bottom end surface of the left curved portion.

8. The cover window of claim 1, further comprising a colored film which overlaps the top curved portion and the first corner curved portion.

9. The cover window of claim 8, wherein the colored film further overlaps the flat portion and the left curved portion to expose a portion of the flat portion and the left curved portion.

10. The cover window of claim 1, wherein in the top plan view,
the first corner curved portion includes a first boundary at which the inner surface thereof and the bottom end surface thereof meet, and
the first boundary has a parabola shape that is convex toward the outer surface with respect to the flat portion.

11. The cover window of claim 1, wherein in the top plan view,
the first corner curved portion includes a first boundary at which the inner surface thereof and the bottom end surface thereof meet, and
the first boundary is a straight line.

12. The cover window of claim 1, wherein in the top plan view,
the first corner curved portion includes a first boundary at which the inner surface thereof and the bottom end surface thereof meet, and
the first boundary has a parabola shape that is convex toward the flat portion.

13. A display device comprising:
a display panel which displays images with light; and
a cover window which is disposed on a front of the display panel,
wherein the cover window comprises:
a flat portion which defines a front outer surface of the display device, the flat portion comprising in a top plan view, a first side extending in a first direction and a second side which contacts the first side and extends in a second direction different from the first direction;
a top curved portion which contacts the first side of the flat portion and extends from the first side in the second direction;
a left curved portion which contacts the second side of the flat portion and extends from the second side in the first direction; and
a first corner curved portion which connects the top curved portion and the left curved portion to each other,
wherein
in cross-section, the first corner curved portion comprises an outer surface, an inner surface, and a bottom end surface connecting the outer surface and the inner surface to each other, and
in the top plan view,
a width of the bottom end surface of the first corner curved portion, is taken from the inner surface to the outer surface, and
the width of the bottom end surface of the first corner curved portion decreases in a direction away from a central portion of the first corner curved portion.

14. The display device of claim 13, wherein
the display panel comprises: a display area at which the images are displayed, the display area comprising:
a flat display area which provides an image to the flat portion of the cover window to be displayed at the flat portion, and
a left curved display area disposed which provides an image to the left curved portion of the cover window to be displayed at the left curved portion, the left curved display area extended in the first direction from a first side of the flat display area.

15. The display device of claim 14, wherein the display area of the display panel further comprises a top curved display area which provides an image to the top curved portion of the cover window to be displayed at the top curved portion, the top curved display area extended in the second direction from a second side of the flat display area.

16. The display device of claim 15, wherein the display area of the display panel further comprises a first corner curved display area which provides an image to the first corner curved portion of the cover window to be displayed at the first corner curved portion, the first corner curved display area connecting the left curved display area and the top curved display area to each other.

17. The display device of claim 14, wherein the cover window comprises plastic.

18. The display device of claim 13, wherein in the cross-section,
the inner surface of the first corner curved portion of the cover window has a first radius of curvature, and the outer surface of the first corner curved portion of the cover window has a second radius of curvature which is different from the first radius of curvature, and
a thickness of the first corner curved portion varies in a direction from the flat portion to the bottom end surface.

* * * * *